United States Patent
Chiu

(10) Patent No.: US 10,355,179 B2
(45) Date of Patent: Jul. 16, 2019

(54) METHOD OF MANUFACTURING LED PACKAGE

(71) Applicants: LITE-ON ELECTRONICS (GUANGZHOU) LIMITED, Guangzhou (CN); LITE-ON TECHNOLOGY CORPORATION, Taipei (TW)

(72) Inventor: Kuo-Ming Chiu, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 33 days.

(21) Appl. No.: 15/679,536

(22) Filed: Aug. 17, 2017

(65) Prior Publication Data
US 2017/0345979 A1  Nov. 30, 2017

Related U.S. Application Data

(62) Division of application No. 14/135,610, filed on Dec. 20, 2013, now Pat. No. 9,818,918.

(30) Foreign Application Priority Data

Dec. 21, 2012 (CN) .......................... 2012 1 0563777

(51) Int. Cl.
*H01L 33/52* (2010.01)

(52) U.S. Cl.
CPC .... *H01L 33/52* (2013.01); *H01L 2224/45144* (2013.01); *H01L 2224/48091* (2013.01); *H01L 2224/48137* (2013.01); *H01L 2933/005* (2013.01)

(58) Field of Classification Search
CPC . H01L 2224/45144; H01L 2224/48091; H01L 2224/48137; H01L 2933/005; H01L 33/52
See application file for complete search history.

(56) References Cited

U.S. PATENT DOCUMENTS

2002/0122637 A1* 9/2002 Anderson ............ G02B 6/4201
385/89

\* cited by examiner

*Primary Examiner* — Lynne A Gurley
*Assistant Examiner* — Vernon P Webb
(74) *Attorney, Agent, or Firm* — Li & Cai Intellectual Property (USA) Office

(57) ABSTRACT

An LED package structure includes a carrier mounted with a plurality of LED chips, a first glue-layer, a second glue-layer and an encapsulation resin filled within the first and the second glue-layers. The first glue-layer is formed on a top surface of the carrier and has a thin-film structure which is substantially flat on a top surface thereof. The second glue-layer is stacked on the first glue-layer. The second glue-layer has a height higher than that of the first glue-layer. The second glue-layer has a volume greater than that of the first glue-layer. The present invention also provides a method of LED package structure to stably produce a dam structure with uniform shape and high ratio of height/width.

10 Claims, 10 Drawing Sheets

METHOD OF MANUFACTURING LED PACKAGE

CROSS REFERENCE TO RELATED APPLICATIONS

This application is a divisional application of Ser. No. 14/135,610 filed on Dec. 20, 2013, entitled "LED PACKAGE STRUCTURE, DAM STRUCTURE THEREOF, AND METHOD OF MANUFACTURING LED PACKAGE THEREOF", the entire disclosures of which are incorporated herein by reference.

BACKGROUND OF THE INVENTION

1. Field of the Invention

The present invention relates to an LED package structure, a dam structure thereof, and a method of manufacturing the LED package structure thereof; in particular, to an LED package structure which has multiple LED chips disposed on the top surface of the carrier and a dam structure for enclosing a resin encapsulating the LED, and to a method of manufacturing the LED package structure thereof.

2. Description of Related Art

With advancement of LED package technology, integrated circuit and heat-dissipation techniques, the LED application is becoming ever more diverse.

FIG. 1 shows a conventional LED package structure that includes a carrier 9, multiple LED chips 92 disposed on a top surface of the carrier 9, and a dam structure 94 enclosing the LED chips 92. The carrier 9 includes a conducting substrate 90, a dielectric layer D and a conductive layer 91. The LED chips 92 are connected to two sides of the conductive layer 91 by wire bonding. As shown in FIG. 1, wires 921, 922 connect the LED chips 92 to the conductive layer 91. The dam structure 94 may be a white frame enclosing the LED chips 92 and encapsulation resin is filled within (not shown in the FIG. 1). Conventional dam structure is usually made by molding. However, the molding equipment for molding the dam structure has to be modified each time when the light-emitting area of the LED package is changed so as to adjust the contour of the dam structure. It results in an increase in production cost. When the contour of the dam structure needs to be modified, such as the diameter of dam, the configuration of the molding equipment needs to be modified accordingly. Therefore, conventional dam construction formed by molding method does not have enough flexibility when the contour of the dam structure needs to be redesigned.

Another conventional technique is usually applied by using a dispenser to dispense glue material on the periphery of the LED chips 92, and the glue material undergoes curing to form the dam structure 94. This dispensing method often results in defective appearances of the dam structure 94, especially at the starting and ending portions which are prone to protuberances, often leading to the unevenness of the glue surface. The unevenness of the glue surface may further result in the color consistence when the light emitted from the LED chips 92 passes through the unevenness of glue surface. Therefore, shape inconsistency of the dam structure is a concern in mass production.

Moreover, due to restrictions of material properties of glue material, for example when using glue with a thixotropic index of 3.5, the ratio of height to width for the dam structure 94 is usually smaller than 0.8, and is typically ranged between 0.6 and 0.7. Namely, the appearance of the dam structure 94 is relatively fat and wide. However, the amount of LED chips 92 that can be disposed in the light-emitting area are decreased. Therefore, the overall design for LED package is influenced. Additionally, the wire is likely to be pressed by the fat and wide dam structure 94 such that wire malfunction is occurred. (e.g., current leakage.) For example, the wire 921 on the right of FIG. 1 is prone to be pressed by the dam structure 94 which appearance is fat and wide.

Additionally, an optical lens is usually added on LED package for modifying the lighting profile. When constructing the dam structure, the outer diameter of the dam structure must be substantially equal to the inner diameter of optical lens. Therefore, when the outer diameter of the dam is too large, the number of LED chips that can be placed within the light-emitting area will be affected, and the optical lens with standard scale cannot engage with all kinds of the dam structures having different outer diameter.

Hence, the present inventor believes the above mentioned disadvantages can be overcome, and through devoted research combined with application of theory, finally proposes the present disclosure which has a reasonable design and effectively improves upon the above mentioned disadvantages.

SUMMARY OF THE INVENTION

The present disclosure provides an LED package structure, which improves the uneven appearance found in conventional dam structure. The LED package structure has a dam structure with a greater ratio of height to width for reducing the possibility of the wires being pressed over by a fat and wide dam, and for reducing the amount of area occupied on the carrier thereby increasing the light emitting area and facilitating the installment of a secondary optic on the LED package structure.

The present disclosure also provides a method of manufacturing the LED package structure. This method provides the advantage of uniform dam structure with greater ratio of height to width. The dam structure can be stably produced with the same appearance by the above manufacturing method.

The present disclosure has the following advantages. Dispensing method is used to form the dam structure instead of molding method. With the absence of mold equipment, the production cost can be reduced. Additionally, the dam structure has the properties of same appearance and higher ratio of height to width by means of a two-step dispensing method which is relatively simple and reliable. In this regard, the overall yield rate of the LED package structure is increased. Moreover, the bi-layered dam structure of the present disclosure has a greater ratio of height to width, such that the wire is less likely to be pressed by the dam, and more space is created on the functional area of the carrier in order to accommodate more LED chips.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
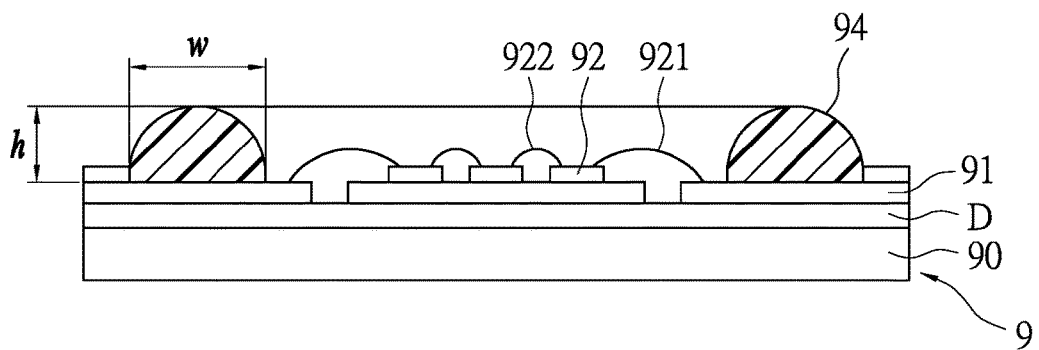
FIG. 1 shows a cross-sectional diagram of a conventional LED package structure.
Figure 2:
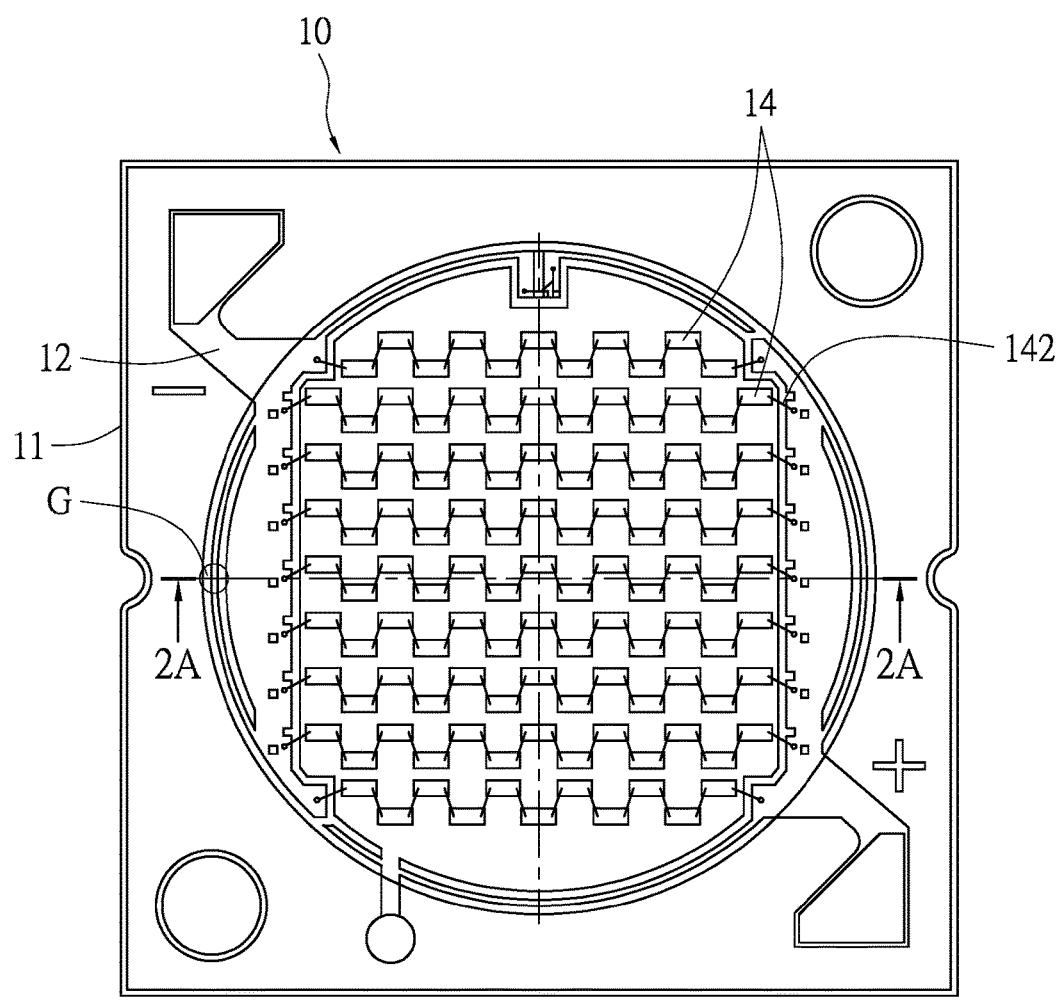
FIG. 2 shows a plan view of an LED package structure of a first embodiment of the present disclosure.
Figure 2A:
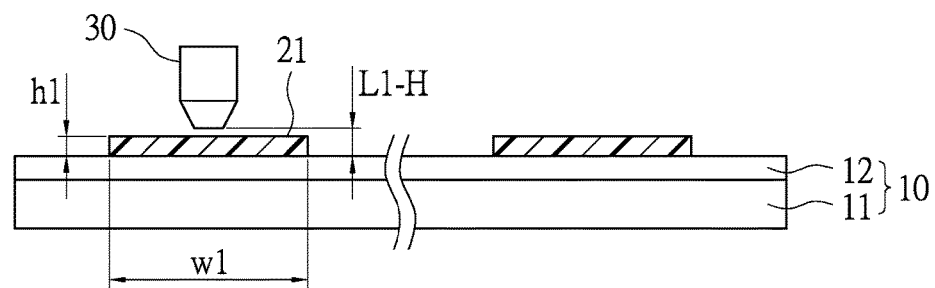
FIG. 2A shows a perspective diagram of a first glue-layer of an LED package structure of a first embodiment of the present disclosure.
Figure 2B:
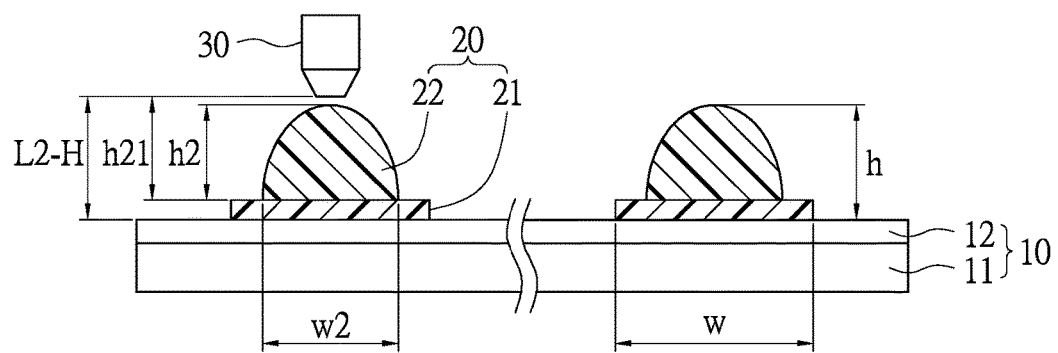
FIG. 2B shows a perspective diagram of a second glue-layer of an LED package structure of a first embodiment of the present disclosure.

FIG. 2 shows a plan view of an LED package structure of a first embodiment of the present disclosure. The LED package structure of the present disclosure includes a carrier 10 and a plurality of LED chips 14 disposed on the carrier 10. The LED chips 14 are connected to each other by wires. After the connection of LED chips 14, the LED chips 14 are further connected to a conductive layer 12 by wires (such as gold wires, metal alloy wires, etc.). An enlarged cross-sectional view of the LED package structure is shown in FIG. 2. FIG. 2A and FIG. 2B are schematic diagrams of the first glue-layer and the second glue-layer of the LED package structure of the present disclosure respectively. The method of manufacturing dam structure of LED package structure of the present disclosure includes the following steps. In first, as shown in FIG. 2A, a carrier 10 is provided. The carrier 10 has a flat top surface for at least one LED chip to be mounted thereon. The carrier 10 includes a substrate 11 and a conductive layer 12 disposed thereon. The substrate 11 can be a conducting substrate or an insulating substrate such as a ceramic substrate, an aluminum substrate, silicon substrate, silicon carbide substrate, an aluminum oxide substrate or an aluminum nitride, etc. The material of the conductive layer 12 can be gold, silver, nickel, palladium, copper, etc. In the case of the insulating substrate 11, the conductive layer 12 is usually disposed on the substrate 11 and the plurality of LED chips 14 are connected to the conductive layer 12 for electrical connection. The electrical connection is constructed by bonding wires 142 between the LED chips 14 and the conductive layer 12, or flipping the LED chips over the conductive layer having a cathode electrode and an anode electrode. If the substrate 11 is made of a conducting material, a dielectric layer is usually disposed between the conducting substrate 11 and the conductive layer 12. It's not omitted in FIG. 2A and FIG. 2B.

Regarding the method of manufacturing dam structures according to the present disclosure. At first, a first glue-layer 21 is disposed on the top surface of the carrier 10 such that the first glue-layer 21 resembles a thin layer having a substantially flat top surface. The location of the first glue-layer 21 is as shown in position G of FIG. 2. Then, as shown in FIG. 2B, a second glue-layer 22 is disposed on the first glue-layer 21, such that the second glue-layer 22 forms a circular rope stacked onto the first glue-layer 21. It should be noted that a height h1 (i.e., first height) is the thickness of the first glue-layer 21 starting from the top surface of the substrate 11 to the top surface of the first glue-layer 21, while a height h2 (i.e., second height) is the thickness of the second glue-layer 22 starting from the top surface of the first glue-layer 21 to a top end of the second glue-layer 22. The height h2 of the second glue-layer 22 is greater than the height h1 of the first glue layer 21. In the present embodiment, the first glue-layer 21 and the second glue-layer 22 are formed by a dispenser (represented by the dispensing tip 30 in FIG. 2B), but is not limited herein. The material of the glue can be silicone resin or epoxy resin, as long as the properties of the two glue layers are similar and can be stably combined (upon curing). For example, the first glue-layer 21 and the second glue-layer 22 can both be made of silicone resin, or both made of Epoxy resin, or one is made of silicone resin and the other is made of epoxy resin. In order to increase reflectivity, a highly reflective material such as titanium dioxide (TiO2) may be added to the glue.

It must be explained that under normal circumstances, the glue material dispensed by the dispenser has shape corresponding to the shape of the tip hole. If the shape of the tip hole is circular, the glue has a shape of cylinder. However, the tip hole of the dispensing tip can also have a shape of rectangular. By adjusting the dispenser with a set of the first parameters, such as a lower velocity L1-V (or lower pressure L1-P) and a smaller height L1-H (i.e., the distance between the dispensing tip 30 and the top surface of the carrier 10), the first glue-layer 21 can be formed with the property of a thin-film layer that has a substantially flat top surface. The flat top surface of the first glue-layer 21 is provided for the second glue-layer 22 to be disposed thereon, such that the second glue-layer 22 having an appearance with uniform shape is easily reached.

As shown in FIG. 2B, when the dispenser is starting disposing the second glue-layer 22, the dispenser 30 can dispense glue with a set of second parameters, such as a higher velocity L2-V (or lower pressure L1-P) and a smaller height L1-H (i.e., the distance between the dispensing tip 30 and the carrier 10), so that the shape of the second glue-layer 22 is relatively tall and thin Through this, the main part of the dam structure is formed by the second glue-layer 22. Preferably, the pressure L2-P of the second glue-layer 22 of the present embodiment is greater than the pressure L1-P of the first glue-layer 21. The height h21 between the dispensing tip 30 and the top surface of the first glue-layer 21 (as shown in FIG. 2B) is greater than the height L1-H between the dispensing tip 30 and the top surface of the carrier 10 (as shown in FIG. 2A).

Since the material between glue and carrier has different physical property, the interconnection point of the dam structure for connecting the starting point and ending point usually has an appearance of being uneven. Here, the starting point of the dam structure is a point that the dispenser is starting dispensing glue. The ending point of the dam structure is a point that the dispenser is stopping dispensing glue. In order to overcome the above issue, the present invention introduces the first glue-layer 21 to be a thin-film layer, the adverse effect of different material property between the carrier and glue can be minimized. Moreover, the second glue-layer 22 upper to the first glue-layer can be disposed onto the first glue-layer 21 such that the overall appearance can be improved. By this configuration, it is easy to produce a plurality of dam structures 20 having the property of the same structure and uniform appearance in mass production. From which, the color shift of the encapsulated resin mixed with the phosphor due to the non-smooth surface of the dam structure 20 will not be occurred. Moreover, the dam structure 20 with the bi-layer form of the present disclosure can be manufactured into a taller and leaner (greater ratio of height to width) dam. The method of producing taller and leaner dam structure prevents the wire from being pressed by the dam, and the area occupied by the dam structure on the carrier 10 is decreased so as to increase the functional area (i.e., the light-emitting area) for disposing more LED chips. A conventional single-layered dam structure has a ratio of height to width between 0.6-0.7. Compared to the conventional ratio, the ratio of height to width (as shown on the right side of FIG. 2B) according to examples from experiments of the present disclosure can be greater or equal to 0.8. Furthermore, the ratio of height to width of the present disclosure can even be as great as 2.

Figure 3:
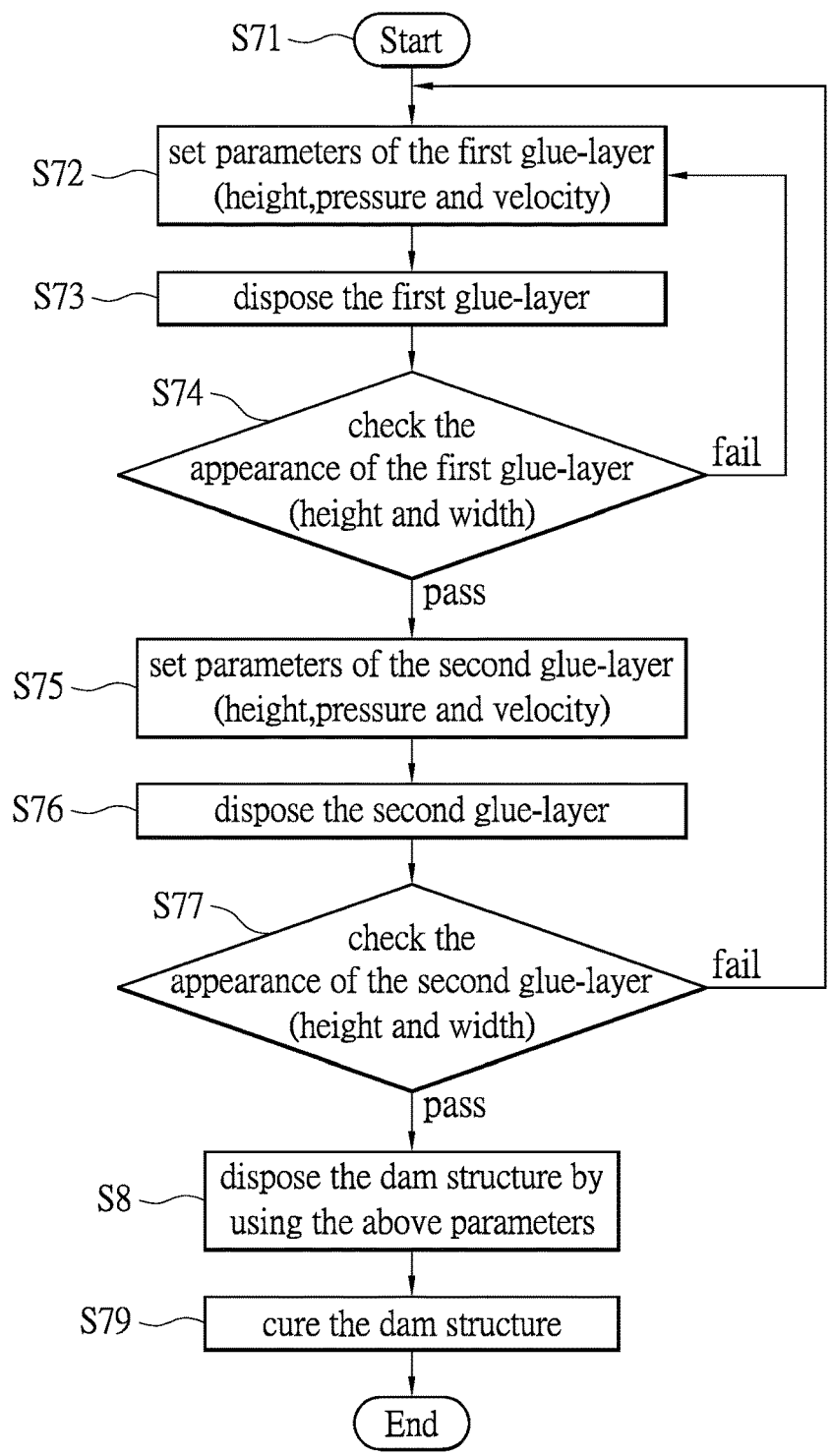
FIG. 3 shows a flowchart of a preparatory procedure for forming the dam structure of the present disclosure.
Figure 5A:
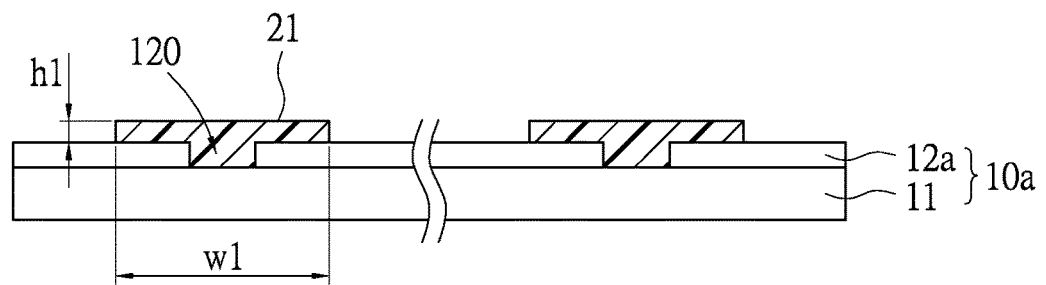
FIG. 5A shows a perspective diagram of a first glue-layer of an LED package structure of a second embodiment of the present disclosure.

FIG. 3 shows a flowchart of a preparatory procedure for forming the dam structure of the present disclosure. The present disclosure has a preparatory procedure before the dam structure is disposed. The preparatory procedure provides suitable manufacturing parameters of the dispenser 30 before the formation of the dam structure. At First, as shown in step S72, the parameters for the first glue-layer are set. Namely the parameters of forming the first glue-layer by the dispenser are configured (the set of first parameters), such as height L1-H, pressure L1-P, and velocity L1-V, etc. Then in step S73, the first glue-layer is disposed on the carrier (as shown in FIG. 2A). After step S73, the first glue-layer can be cured. However, this curing process can be omitted at this step. It should be noted that a width w1 is defined as a projected length of the first glue-layer as shown in FIG. 5A. Then in step S74, the appearance of the first glue-layer is evaluated. The first glue-layer is mainly checked by its width w1, height h1 and the flatness of the top surface of the first glue-layer. These measurements should meet the expected specifications, such that the first glue-layer does not occupy too much space on the carrier than it is needed. If the result does not meet the expected specifications, step S72 should be implemented again, and the parameters are re-adjusted. The first glue-layer which is disposed in step S73 can be wiped off in the preparatory procedure because of that the first glue-layer is not cured. If the appearance of the first glue-layer satisfies the expected specifications, it suggests that the parameters of the dispenser satisfy the expected specifications. After the first glue-layer is cured, step S72 does not need to be implemented again, and the following steps can be directly proceeded with. In other words, the second glue-layer can be directly disposed on the cured first glue-layer.

As shown in step S75, the parameters of the second glue-layer (the set of second parameters) are set. Namely the parameters of forming the second glue-layer by the dispenser are configured. The parameters include, but are not limited to, height L2-H, pressure L2-P and velocity L2-V, etc. Then in step S76, the second glue-layer is disposed on the first glue-layer. In step S77, the appearance of the second glue-layer is evaluated. The second glue-layer is mainly checked by its width w2, height h2, to see whether these measurements satisfy the expected specifications or not. If the overall dam structure satisfies the preset specifications, it suggests that the parameters of the dispenser satisfy the expected specifications. Therefore, the parameters for forming the dam structure are obtained. A disposing procedure can then be proceeded with according to the parameters that are set in the preparatory procedure. In step S8 the dam structure is disposed on the carrier. The detail of forming the dam structure is explained in FIG. 4. Finally, step S79 is carried out, curing the dam structure. The curing method includes heating, UV curing or the like. If the second glue-layer does not satisfy the preset specifications, then the step S72 should be implemented again and the first glue-layer should be disposed again. Regarding the step of curing the dam structure, baking can be carried out after the formation of both the first glue-layer and the second glue-layer being disposed on the carrier. Alternatively, the step of baking can be carried out after the formation of the first glue-layer in step S73, and after the formation of the second glue-layer in step S76 individually.

In supplemental explanation, the dam structure of the LED package structure can be constructed in two different ways mentioned below. After the steps of chip-mounting and wire-bonding, the dam structure can later be disposed on the carrier. Or after the dam structure is disposed, the steps of chip-mounting and wire-bonding are implemented.

Figure 3A:
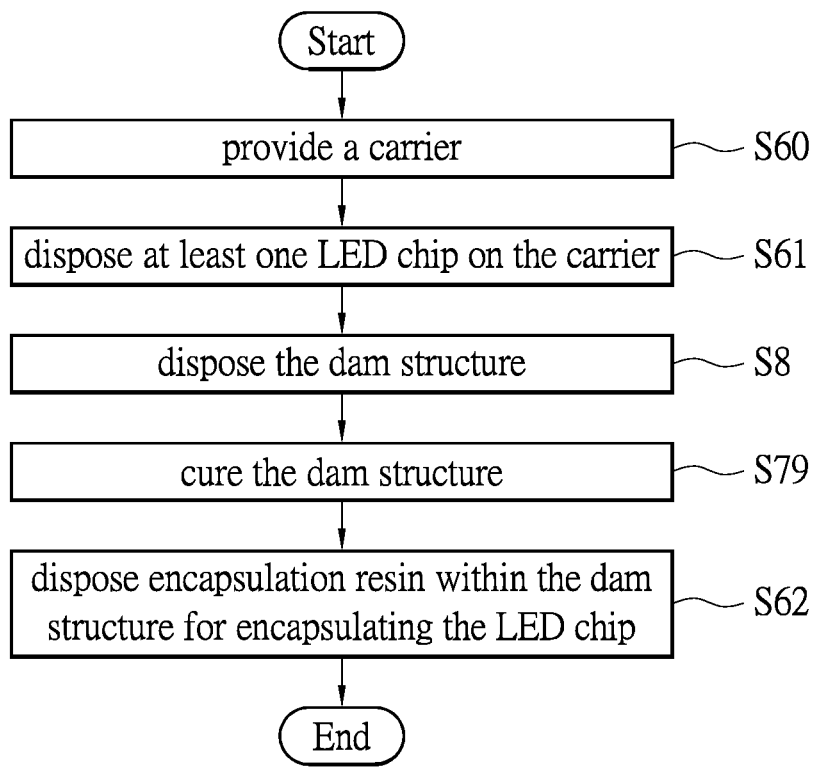
FIG. 3A shows a flowchart of a manufacturing method of an LED package structure of a first embodiment of the present disclosure.

FIG. 3A shows a flowchart of a manufacturing method of an LED package structure of a first embodiment of the present disclosure. In step S60, a carrier is provided. In step S61, at least one LED chip is disposed on the carrier. In step S8, the dam structure with bi-layer form is disposed on the carrier. In step S79, the dam structure with bi-layer form is cured. After the dam structure is cured at step S79, the encapsulation process is carried out at the end. As shown in step S62, an encapsulation resin is disposed within the dam structure for encapsulating the LED.

Figure 3B:
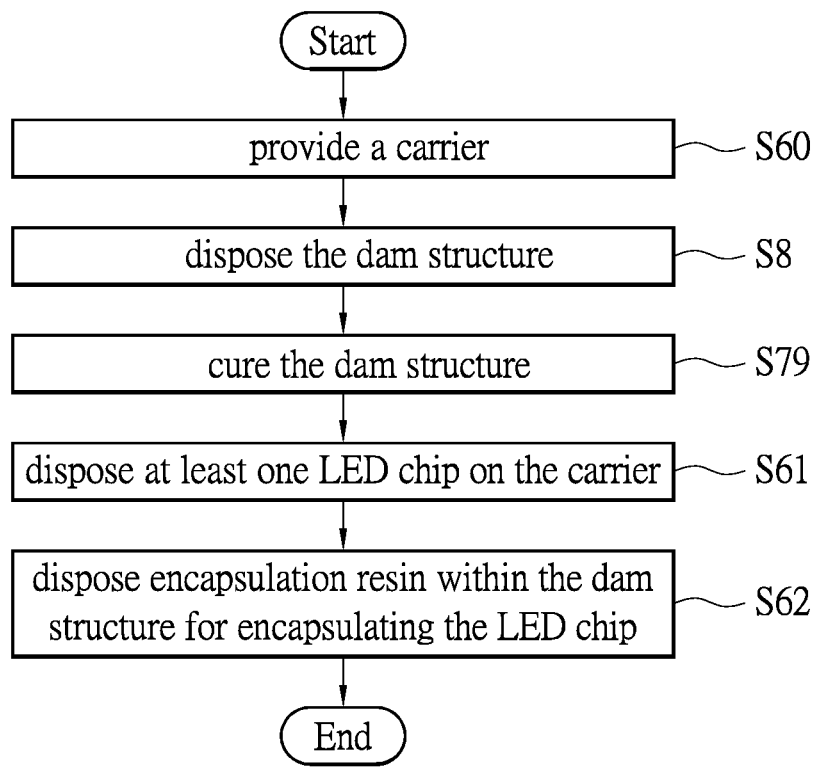
FIG. 3B shows a flowchart of a manufacturing method of an LED package structure of a second embodiment of the present disclosure.

FIG. 3B shows a flowchart of a manufacturing method of an LED package structure of a second embodiment of the present disclosure. In step S60, a carrier is provided. In step S8, the dam structure with bi-layer form is disposed on the carrier. In step S79, the dam structure with bi-layer is cured. After the dam structure is cured at step S79, step S61 is carried out. In step S61, at least one LED chip is disposed within the dam structure. Finally, the encapsulation process is carried out. As shown in step S62, an encapsulation resin is disposed within the dam structure for encapsulating the LED.

Regarding the relationship between the two sets of first and second parameters, according to one of the embodiments of the present disclosure, the first height setting L1-H and the first pressure setting L1-P for disposing the first glue-layer are lower than the second height setting L2-H and the second pressure setting L2-P for disposing the second glue-layer. In other words, a smaller height (i.e., the first height setting L1-H is smaller than the second height setting L2-H.) and smaller pressure (i.e., the first pressure setting L1-P is smaller than the second pressure setting L2-P) are used to form a flat top surface of the first glue-layer. The first glue-layer is formed with a thin-film structure. Then, the taller second glue-layer is formed on top of the first glue-layer with a greater pressure L2-P (i.e., the second pressure setting L2-P is larger than the first pressure setting L1-P) and a greater height (i.e., the second height setting L2-H is larger than the first height setting L1-H). The velocity of disposing the first glue-layer and the second-glue layer can be similar.

Figure 4:
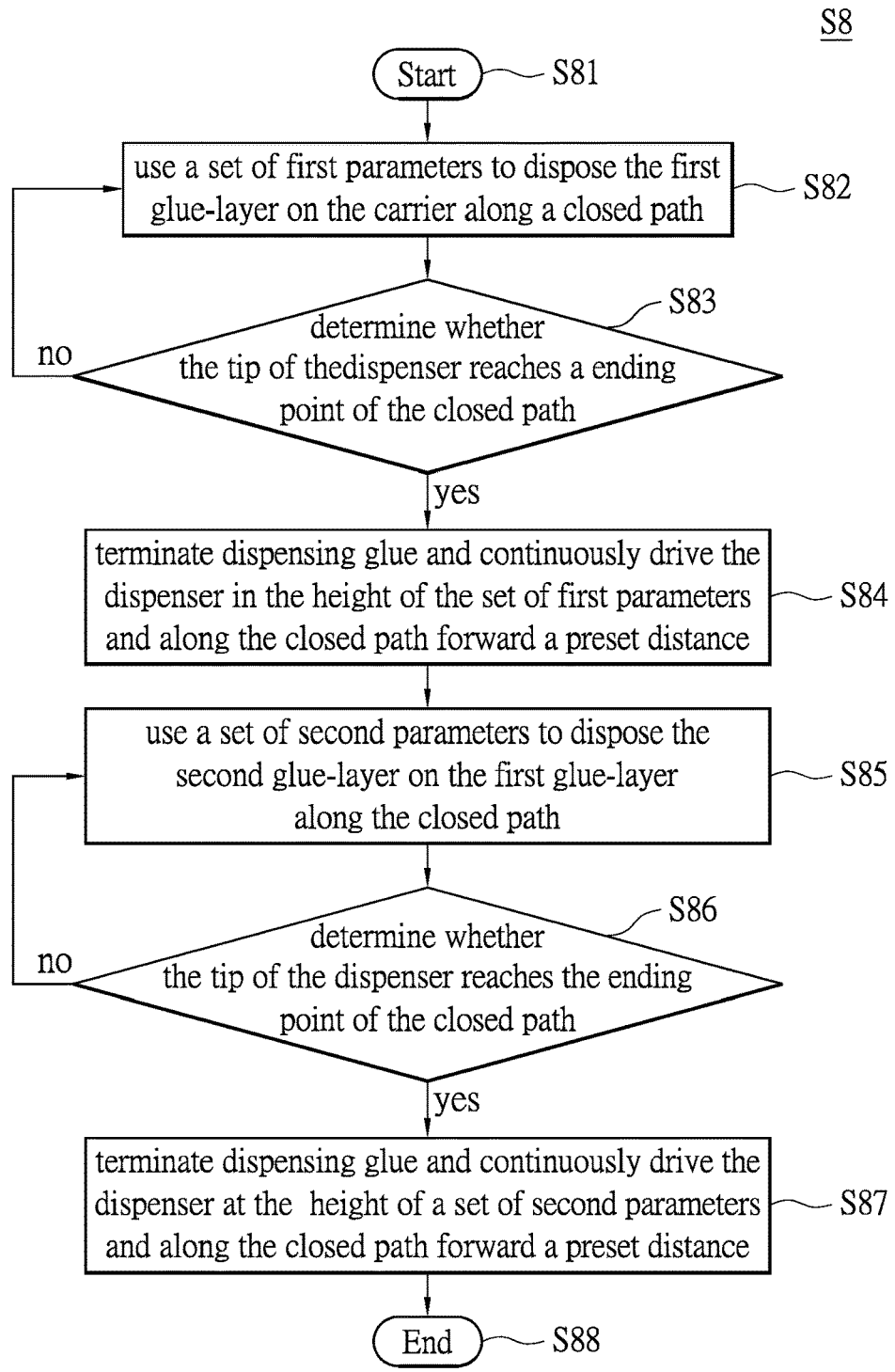
FIG. 4 shows a flowchart of a disposing procedure for forming the dam structure of an LED package structure of the present disclosure.

FIG. 4 shows a flowchart of a disposing procedure of a manufacturing method of forming a dam structure of an LED package structure. After the sets of first and second parameters of the dispenser have been confirmed, formal dam structure can be disposed on the top surface of the carrier. First, in step S82, using the set of first parameters (including pressure L1-P, first height L1-H, and velocity L1-V) to dispose the first glue-layer along a closed path. Here, the closed path of the present embodiment can be a circle, but is not limited herein. For example, the closed path can be a shape of oval, rectangular, and etc. It is worthy that the dispensing path should meet a condition that the dispensing path is a closed path.

As shown in step S83, it is determined whether the dispenser has reached the ending point of the closed path. In other words, it has to be ensured that the dispenser starts dispensing from a starting point to the ending point after the dispenser dispenses along the closed path. The movement path of the dispenser can be programmed by a computer or determined by a machine having an ability of visual identification so as to ensure the dispenser reaching to the ending point. If the dispenser is not reaching the ending point, the dispenser continues dispensing glue and moves along the closed path until the dispenser reaches the ending point. If the dispenser is reaching the ending point, step S84 can be implemented. In step S84, the dispenser terminates dispensing glue, and the dispenser move forward a preset distance along the closed path at the first height L1-H (i.e., the first height setting). Namely, the dispensing tip of the dispenser stops dispensing glue and stays at the original height (i.e., the first height L1-H). Then, the dispenser moves forward a preset distance and then raises the dispensing tip according to the parameters of the next step. The preset distance can be one fourth to one third cycle of the closed path. This method avoids bulge formation on the interconnection point that interconnects the starting point and the ending point. More specifically, unevenness usually occurs when stopping dispensing glue and pulling up the dispensing tip at the same time. The surface tension of the glue results in bulge formation. However, the dam structure of the present disclosure is uniform because the dispenser keeps moving forward the present distance but not dispensing glue after it reaches the ending points.

As shown in step S85, the dispenser is going along the closed path according to the set of second parameters (including pressure L2-P, the second height L2-H, and velocity L2-V) and, the second glue-layer is disposed on the first glue-layer. The path of the second glue-layer is similar to the path of the first glue-layer. Similarly, as shown in step S86, it is determined whether the dispenser has reached the ending point of the closed path. If not, the above step should continue. Namely, the dispenser keeps dispensing glue. If the dispenser has reached the ending point of the closed path, step S87 is carried out. In step S87, dispensing is terminated, and the dispenser is driven further forward of a preset distance at the height of the set of second parameters and along the closed path. Namely, in the formation of the second glue-layer, when the dispenser completes a lap and reaches the ending point, the dispensing tip of the dispenser stops dispensing glue and stays at the original height. The dispenser then continues moving forward of a preset distance. The preset distance is one fourth to one third cycle of the closed path of the second glue-layer.

The first glue-layer and the second glue-layer as described in the present embodiment can be disposed by the same dispenser. Namely, the first glue-layer and the second glue layer are dispensed by the same dispenser. However they can also be disposed by different dispensers. Namely, the first glue-layer is formed by one dispenser, and the second glue-layer is formed by another dispenser.

Figure 5B:
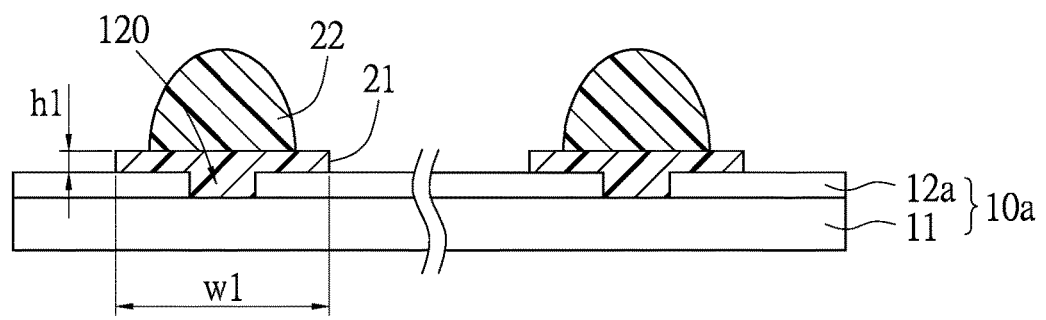
FIG. 5B shows a perspective diagram of a second glue-layer of an LED package structure of a second embodiment of the present disclosure.

FIG. 5A and FIG. 5B respectively show perspective diagrams of a first glue-layer and a second glue-layer of an LED package structure of a second embodiment of the present disclosure. A manufacturing method can further include forming a trench 120 on the carrier 10a, namely forming a trench 120 on the conductive layer 12a. The first glue layer 21 is disposed over the trench 120, and the width of the first glue-layer 21 is greater than the width of the trench 120. Namely, the covering area of the first glue-layer 21 is greater than the occupy area that the trench 120 is formed thereon. Therefore, the trench provides the benefit of increasing the adhesion between the first glue layer 21 and the carrier 10a.

Figure 6:
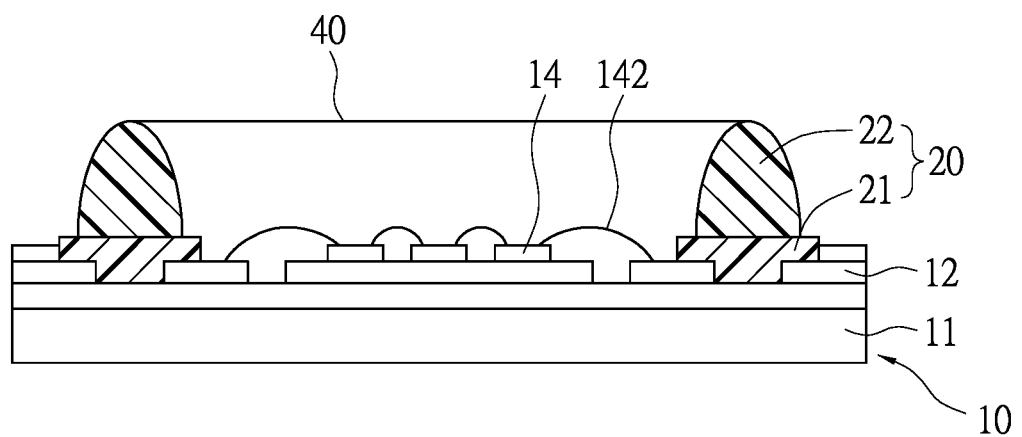
FIG. 6 shows a cross-sectional view of the LED package structure of a second embodiment of the present disclosure.

FIG. 6 shows a cross-sectional view of a completed LED package structure of the present disclosure. After completing a dam structure 20 with bi-layer form, an encapsulation resin 40 is then formed within the dam structure 20. The encapsulation resin 40 may include fluorescent material. The LED package structure of the present disclosure is completed at this stage. The number of LEDs 14 in FIG. 6 is merely schematic. It's not limited to the present invention.

Figure 7A:
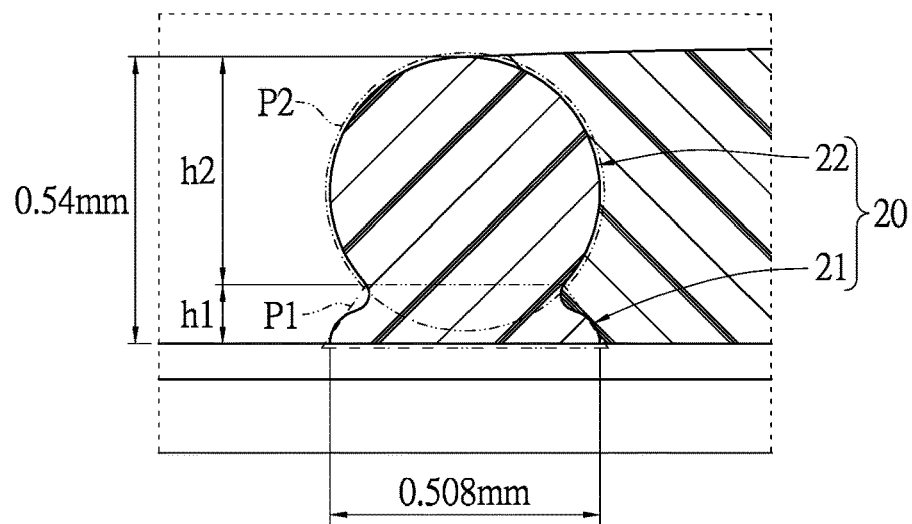
FIG. 7A and FIG. 7B show cross-sectional schematic diagrams of bi-layered dam structure according to the present disclosure.
Figure 7B:
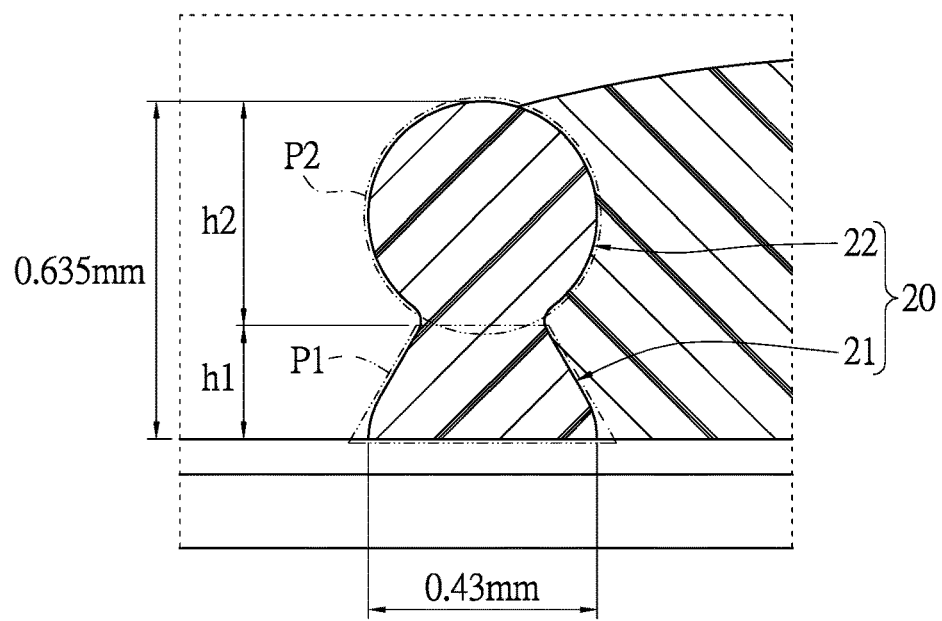

Table 1 represents the manufacturing parameters of single-layered dam structure. The conventional single-layered dam structures are served as reference. Refer to the following Table 2, which shows the four sets of parameters in regard to bi-layered disposing procedure of the present disclosure. FIG. 7A and FIG. 7B are cross-sectional schematic diagrams of two-layered dams which are formed according to the present disclosure.

Table 1 represents the manufacturing parameters of single-layered dam structure.

| parameter | Manufacturing process of single-layered dam structure set | | |
|---|---|---|---|
| | First set | Second set | Third set |
| L1-P (KPa) | 300 | 260 | 220 |
| L1-H (mm) | 0.58 | 0.58 | 0.58 |
| L1-V (mm/s) | 7.33 | 7.33 | 7.33 |
| h (mm) | 0.56 | 0.435 | 0.41 |
| w (mm) | 0.8 | 0.63 | 0.61 |
| h/w ratio | 0.7 | 0.69 | 0.67 |

According to the set of first parameters, the conventional first-set parameters, the ratio of height to width of is 0.7. According to the set of second parameters, the conventional second-set parameters, the ratio of height to width of is 0.69. According to the set of third parameters, the conventional third-set parameters, the ratio of height to width of is 0.67.

Based on the above, when the dispensing tip is staying in a height (for example, the height setting is 0.58 mm as mentioned above) and with the smaller pressure, the height of conventional dam structure is smaller and the ratio of height to width of the conventional dam structure is also smaller. Further, the ratio of height to width of the conventional dam structure is not larger than 0.7.

Table 2 represents the manufacturing parameters of bi-layered dam structure of the present disclosure.

| parameter | Manufacturing process of two-layered dam structure set | | | |
|---|---|---|---|---|
| | First set | Second set | Third set | Fourth set |
| L1-P (KPa) | 100 | 100 | 100 | 100 |
| L1-H (mm) | 0.2 | 0.2 | 0.2 | 0.2 |
| L1-V (mm/s) | 7.33 | 7.33 | 7.33 | 7.33 |
| L2-P (KPa) | 100 | 120 | 140 | 170 |
| L2-H (mm) | 0.55 | 0.55 | 0.65 | 0.7 |
| L2-V (mm/s) | 7.33 | 7.33 | 7.33 | 7.33 |
| h (mm) | 0.41 | 0.54 | 0.635 | 0.83 |
| w (mm) | 0.495 | 0.508 | 0.43 | 0.41 |
| h/w ratio | 0.823 | 1.06 | 1.48 | 2.02 |
| | | Refer to FIG. 7A | Refer to FIG. 7B | |

Based on the first set of parameters of the dam structure with bi-layer form of the present embodiment, the first pressure setting L1-P for forming the first glue-layer is set at 100 kPa, the first height setting L1-H is 0.2 mm, the first velocity L1-V setting is set to be 7.33 mm/s; the second pressure setting for forming the second glue-layer L2-P is 100 kPa, the second height setting L2-H is 0.55 mm, the second velocity setting L2-V is set to be 7.33 mm/s. The resulting dam structure has height (h) of 0.41 mm, and width (w) of 0.495 mm. The ratio of height to width is 0.823. The dam structures of the present disclosure are taller and leaner than the conventional invention.

Based on the second set of parameters of the dam structure with bi-layered form of the present embodiment, the first pressure setting L1-P for forming the first glue-layer is 100 kPa, the first height setting L1-H is 0.2 mm, the first velocity setting L1-V is 7.33 mm/s; the second pressure setting L2-P for forming the second glue-layer is 120 kPa, the second height setting L2-H is 0.55 mm, the second velocity setting L2-V is 7.33 mm/s. The resulting dam structure has height (h) of 0.54 mm, and width (w) of 0.508 mm. The ratio of height to width is 1.06. The dam structures of the present disclosure are taller and leaner than the conventional invention.

Based on the third set of parameters of the dam structure with bi-layered form of the present embodiment, the first pressure setting L1-P for forming the first glue-layer is 100 kPa, the first height setting L1-H is 0.2 mm, the first velocity setting L1-V is 7.33 mm/s; the second pressure setting L2-P is 140 kPa, the second height setting L2-H is 0.65 mm, the second velocity setting L2-V is 7.33 mm/s. The resulting dam structure has height (h) of 0.635 mm, and width (w) of 0.43 mm. The ratio of height to width is 1.48.

Based on the fourth set of parameters of the dam structure with bi-layered form of the present embodiment, the first pressure setting L1-P is 100 kPa, the first height setting L1-H is 0.2 mm, the first velocity setting L1-V is 7.33 mm/s; the second pressure setting L2-P for forming the second glue-layer is 170 kPa, the second height setting L2-H is 0.7 mm, the second velocity setting L2-V is 7.33 mm/s. The resulting dam structure has height (h) of 0.83 mm, and width (w) of 0.41 mm. The ratio of height to width is 2.02. The dam structures of the present disclosure are taller and leaner than the conventional invention.

More specifically, the dam structures of the four sets of parameters of the present embodiment are taller and leaner when comparing with conventional embodiments. The dam structure with bi-layer form can provide more functional area by reducing the occupied area that the dam is disposed thereon so that the more LED chips can be accommodated on the functional area. Additionally, the wire is less likely to be pressed by the dam structure, avoiding the risk of current leakage. Moreover, the overall ratio of height to width of the first glue-layer and the second glue-layer can be greater than 0.8 Further still, the ratio of height to width of the first and second glue-layers can be as great as 2.

Actually, the width w1 of the first glue-layer is greater than or equal to the width w2 of the second glue-layer. The first glue-layer has a greater width and serves as the foundation for disposing the second glue-layer. In this regard, the second glue-layer can be stably disposed on the first glue-layer. The first pressure setting L1-P of the dispenser for forming the first glue-layer is smaller than the second pressure setting L2-P of the dispenser for forming the second glue-layer, such that the more glue is dispensed from the tip hole for forming the second glue-layer. Therefore, a greater cross-sectional area of the second glue-layer is formed. The volume of the first glue-layer is smaller than the volume of the second glue-layer, since the first glue-layer is the foundation. In actual implement, the volume of the second glue-layer is two to four times the volume of the first glue-layer.

In conventional techniques, when using glue material with a thixotropic index of 3.5 to form a single-layered dam structure, the ratio of height to width is approximately between 0.6-0.7. In the present disclosure, glue material with a thixotropic index of 3.5 is used, two-step disposing method for forming the dam structure with bi-layer form is carried out, and the ratio of height to width is approximately between 0.8-2. That is to say, the present disclosure successfully overcomes limitations of material property and produces dam structure with higher ratio of height to width.

Additionally, in conventional techniques, when using glue material with a thixotropic index of 7.5 to form a single-layered dam structure, the ratio of height to width is approximately between 0.9-1. However, the dam structure is not uniformly shaped. When the glue material with a thixotropic index of 7.5 is used and two-step dispensing for forming the dam structure with bi-layer form is carried out in the present disclosure, a ratio of height to width exceeding the above limitation (i.e., h/w>1.0) can be easily obtained. The present invention not only can obtain a dam structure having a uniform shape but also provide a taller and leaner dam structure.

Thixotropic index is an index that reflects the ability that the fluid restores to the original structure when the fluid is subject to shear stress. The greater the thixotropic index is, the better thixotropic the material will be. Namely, the greater the thixotropic index is the effect that the fluid restores the original structure will be better when the fluid is subject to structural damage by shear stress. In other words, the thixotropic index with the greater value signifies better thixotropic quality and less downward slipping. In another embodiment of the present disclosure, the thixotropic index of the second glue-layer 22 is 7.5, and the thixotropic index of the first glue-layer 21 is 3.5. When the thixotropic index of the second glue-layer 22 is greater than the thixotropic index of the first glue-layer 21, the second glue-layer 22 is subject to less downward slipping after being disposed on the first glue-layer 21. In other words, the dam appearance is more easily maintained. Also, dam structure with uniform shape is easily obtained.

Based on the above, the dam structure 20 of the present disclosure has at least two glue layers. First, the first glue-layer 21 with a thin-film structure is disposed on the surface of the carrier 10, serving as a foundation. Then, the second glue-layer 22, having the same (or similar) physical property as the first glue-layer 21, is disposed on the first glue-layer 21. The conventional single-layered dam structure is disposed on the carrier, and the different physical property between the carrier and the glue layer often results in uneven appearance. Namely the glue layer is not stable enough to form a uniform dam structure on the carrier. The second layer of the dam structure of the present disclosure is disposed on a foundation having similar physical property (i.e., the first glue-layer) so as to reduce the interference caused by diverted materials, and the appearance is improved. In alternative embodiment, the second glue-layer and the first glue-layer of the present disclosure do not need to meet the requirement of the same material. In other word, the materials of the first and second glue-layers can have similar physical property.

From the cross-sectional diagrams of the dam structures of the present disclosure, such as FIG. 7A and FIG. 7B, it can be seen that the interconnection parts between the first glue-layer 21 and the second glue-layer 22 are slightly concaved due to the surface tensions of the glue. In other words, the bottom part of the second glue-layer 22 concaves inward and then slantingly extends outwards to connect to the top surface of the first glue-layer 21, the cross section of the dam structure formed by the first and the second glue-layer (21, 22) is key-hole shaped, or a substantially spherical shape. In other words, the key-hole shape is formed by a trapezoidal base portion (P1) and a circular top portion (P2) with a substantially circular cross-sectional profile stacked thereon. Additionally, given that the volume of the second glue-layer is approximately 2-4 times greater than the volume of the first glue-layer, it can be inferred that the ratio of first height h1 of the first glue-layer to second height h2 of the second glue-layer is approximately between 0.2-0.4. According to the experimental results of the four sets of parameters in the present disclosure, the abovementioned ratio of first height to second height is substantially the same as the ratio of the first height setting L1-H to the second height setting L2-H.

In summary, the present disclosure has at least one of the following advantages. The molding is replaced by dispensing so as to avoid the use of molding equipment. From which, the production cost can be reduced by without using the molding equipment. The dispensing tip of the dispenser further moves a preset distance from the ending point after glue dispensing is terminated. Therefore the protuberances at the interconnection point are minimized, such that the glue surface of the dam structure is flat. As a result, the fluorescent material mixed within the encapsulated resin can be uniformly distributed within the dam structure, and the color consistency of the LED package structure can be achieved. The present invention introduces the glue having high thixotropic index to form a bi-layered dam structure, such that the manufacturing process is simplified. Then the dam structure has uniform shape. Moreover, the overall yield rate of the LED package structure is improved in the absence of poor dam appearance. The number of LED chips disposed within the dam structure is increased because the taller and leaner dam structure. Also, by forming the taller and leaner dam structure, the wiring portion can be far away from the dam structure, such that the wire is less likely to be pressed by the dam structure during manufacturing process. Therefore, the risk of current leakage is avoided. A secondary optics can be directly engaged with the dam structure in lamp manufacturing. That is to say, the engagement between the dam structure and the secondary optics can be strengthened without additional screws or adhesive paste.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A manufacturing method of LED package structure, comprising the following steps:
    disposing a first glue-layer on a top surface of a carrier by a dispenser using a first height setting and a first pressure setting, wherein the first height setting represents a distance between a dispenser tip of the dispenser and the top surface of the carrier; and
    disposing a second glue-layer on the first glue-layer by the dispenser using a second height setting and a second pressure setting, wherein the second height setting represents the distance between the dispenser tip and the top surface of the carrier;
    wherein the second height setting is greater than the first height setting, the second pressure setting is greater than the first pressure setting, and a volume of the second glue-layer is greater than that of the first glue-layer;
    wherein disposing the first glue-layer or the second-glue layer further comprises the following steps:
    dispensing the first glue-layer or the second-glue layer by the dispenser along a closed path from a starting point of the closed path, wherein the starting point is a point that the dispenser starts dispensing glue;
    terminating a dispensing action upon the dispenser tip of the dispenser reaching an ending point of the closed path contiguous to the starting point, wherein the ending point is a point that the dispenser stops dispensing glue; and
    staying the dispenser at the first height setting without dispensing glue and moving the dispenser tip forward a preset distance along the closed path from the ending point to a preset point to flatten a glue accumulated bulge at an interconnection of the starting point and the ending point, wherein the preset distance is defined between the ending point and the present point.

2. The manufacturing method of LED package structure according to claim 1, wherein the preset distance is one-fourth to one-third of the closed path.

3. The manufacturing method of LED package structure according to claim 1, wherein a first height of the first glue-layer is substantially equal to the first height setting of the dispenser, the second height setting is substantially equal to a sum of the first height of the first glue-layer and a second height of the second glue-layer; and the second height of the second glue-layer is greater than the first height of the first glue-layer.

4. The manufacturing method of LED package structure according to claim 1, after disposing the first glue-layer and the second glue-layer to form a dam structure, further comprising the step of disposing at least one LED chip on the carrier, wherein the first glue-layer and the second glue-layer surround the at least one LED chip.

5. The manufacturing method of LED package structure according to claim 4, after disposing the LED chip on the carrier, further comprising the step of disposing an encapsulation resin within the dam structure for encapsulating the LED chip.

6. The manufacturing method of LED package structure according to claim 1, before disposing the first glue-layer and the second glue-layer to form a dam structure, further comprising the step of disposing at least one LED chip on the carrier.

7. The manufacturing method of LED package structure according to claim 6, after disposing the first glue-layer and the second glue-layer to form the dam structure, further comprising the step of disposing an encapsulation resin within the dam structure for encapsulating the LED chip.

8. The manufacturing method of LED package structure according to claim 1, further comprising steps after disposing the first glue-layer as follows:
flattening a top surface of the first glue-layer to form a flat top surface; wherein a bottom contact surface of the second glue-layer and the flat top surface of the first glue-layer are of a same size and same shape, the bottom contact surface of the second glue-layer and the flat top surface of the first glue-layer contact with each other and are coincident when viewed in planar view.

9. The manufacturing method of LED package structure according to claim 8, further comprising steps:
forming a top surface of the second glue-layer that is substantially in the shape of a circular arc in a radial cross section comprising at least three quarters of a full circle and intersecting inner and outer surfaces of the first glue-layer in a substantially seamless manner.

10. A manufacturing method of LED package structure, comprising the following steps:
disposing a first glue-layer on a top surface of a carrier by a dispenser using a first height setting and a first pressure setting, wherein the first height setting represents a distance between a dispenser tip of the dispenser and the top surface of the carrier;
disposing a second glue-layer on the first glue-layer by the dispenser using a second height setting and a second pressure setting, wherein the second height setting represents the distance between the dispenser tip and the top surface of the carrier; wherein the second height setting is greater than the first height setting, the second pressure setting is greater than the first pressure setting, and a volume of the second glue-layer is greater than that of the first glue-layer;
flattening a top surface of the first glue-layer to form a flat top surface; wherein a bottom contact surface of the second glue-layer and the flat top surface of the first glue-layer are of a same size and same shape, the bottom contact surface of the second glue-layer and the flat top surface of the first glue-layer contact with each other and are coincident when viewed in planar view; and
forming a top surface of the second glue-layer that is substantially in the shape of a circular arc in a radial cross section comprising at least three quarters of a full circle and intersecting inner and outer surfaces of the first glue-layer in a substantially seamless manner;
wherein the bottom contact surface of the second glue-layer and the flat top surface of the first glue-layer each have two longitudinal edges;
wherein a bottom surface of the second glue-layer has two boundaries representing the two longitudinal edges, respectively, a radial cross section of the first glue-layer has a substantially trapezoidal shape with a top edge coinciding with a bottom edge of a radial cross section of the second glue-layer;
wherein the exposed surface of the trapezoid is curved and convex at the base of the trapezoid, while being curved and concave at the top of the trapezoid where the exposed surfaces of the trapezoid meet the top surface of the second glue-layer in a substantially seamless manner;
wherein a lower portion of the second glue-layer and an upper portion of the first glue-layer form two inward concave surfaces along the two longitudinal edges, respectively.

* * * * *